United States Patent
Lim et al.

(10) Patent No.: US 12,322,614 B2
(45) Date of Patent: Jun. 3, 2025

(54) WAFER EXPANDER FOR UNIFORMLY EXPANDING GAP BETWEEN DIES, AND DIE SUPPLYING MODULE AND DIE BONDING EQUIPMENT INCLUDING SAME

(71) Applicant: SEMES CO., LTD., Cheonan-si (KR)

(72) Inventors: Do Youn Lim, Hwaseong-si (KR); Kuk Saeng Kim, Yongin-si (KR); Wan Hee Jeong, Hwaseong-si (KR)

(73) Assignee: SEMES CO., LTD., Cheonan-si (KR)

( * ) Notice: Subject to any disclaimer, the term of this patent is extended or adjusted under 35 U.S.C. 154(b) by 434 days.

(21) Appl. No.: 17/750,369

(22) Filed: May 22, 2022

(65) Prior Publication Data

US 2023/0207352 A1  Jun. 29, 2023

(30) Foreign Application Priority Data

Dec. 28, 2021 (KR) ........................ 10-2021-0189627

(51) Int. Cl.
*H01L 21/67* (2006.01)
*H01L 21/683* (2006.01)

(52) U.S. Cl.
CPC .... *H01L 21/67132* (2013.01); *H01L 21/6836* (2013.01); *H01L 2221/68336* (2013.01)

(58) Field of Classification Search
CPC ......... H01L 21/67132; H01L 21/67144; H01L 21/6836; H01L 2221/68336
See application file for complete search history.

(56) References Cited

FOREIGN PATENT DOCUMENTS

| JP | 2006-310438 | 11/2006 |
|----|-------------|---------|
| JP | 2012-204747 | 10/2012 |
| JP | 2021-153176 | 9/2021 |
| KR | 10-2020-0121229 | 10/2020 |

OTHER PUBLICATIONS

Patent Family of U.S. Appl. No. 17/750,369.*
Translation of refusal of JP2022-072366.*
Translation of refusal of KR2021-0189627.*
Office Action from the Korean Intellectual Property Office dated Jan. 16, 2024.
Office Action from Japan Patent Office dated Feb. 7, 2023.

* cited by examiner

*Primary Examiner* — Sonya M Sengupta

(57) ABSTRACT

Proposed is a wafer expander for uniformly expanding gaps between dies, and a die supplying module and die bonding equipment including the same. The wafer expander, for supporting a dicing tape to which a plurality of dies are attached and for expanding gaps between the plurality of dies, includes an expander ring detachably coupled to a wafer ring that fixes an edge of the dicing tape, and configured to ascend and descend, and a base ring supporting a bottom side of the dicing tape, and at least a portion thereof is configured to ascend and descend.

9 Claims, 15 Drawing Sheets

WAFER EXPANDER FOR UNIFORMLY EXPANDING GAP BETWEEN DIES, AND DIE SUPPLYING MODULE AND DIE BONDING EQUIPMENT INCLUDING SAME

CROSS REFERENCE TO RELATED APPLICATION

The present application claims priority to Korean Patent Application No. 10-2021-0189627, filed Dec. 28, 2021, the entire contents of which is incorporated herein for all purposes by this reference.

BACKGROUND OF THE INVENTION

Field of the Invention

The present disclosure relates to a wafer expander for uniformly expanding gaps between dies, and a die supplying module and die bonding equipment including the same.

Description of the Related Art

The semiconductor manufacturing process is a process for manufacturing semiconductor products that can process electrical signals, and consists of two stages called front-end and back-end. The front-end refers to a processing process that forms a pattern on a wafer through processing processes such as oxidation, exposure, etching, ion implantation, and deposition. The back-end refers to a packaging process that manufactures a semiconductor package in the form of a finished product through processes such as dicing, die bonding, wiring, molding, marking, and testing for patterned wafers.

Die bonding is a process of attaching individualized dies from a wafer to a substrate (e.g., a printed circuit board (PCB)) through cutting (dicing), and largely consists of a process of separating the die from the wafer and a process of bonding the die to the substrate. In the die separation process, in order to easily separate the die from the wafer, a method of widening the gap between dies by pulling the dicing tape attached to the back side of the wafer outwards is used.

Meanwhile, as the types of semiconductor chips diversify, the types of dies are diversifying, and a die with a large aspect ratio (that is, a large difference between width and height) is one among them. In the case of dies having a large aspect ratio, however, there is a problem that gaps between the dies in a specific direction are not sufficient and the gaps between the dies are not uniform.

SUMMARY OF THE INVENTION

Accordingly, the present disclosure has been made keeping in mind the above problems occurring in the related art, and the present disclosure is intended to provide a wafer expander for uniformly expanding gaps between dies, and a die supplying module and die bonding equipment including the same.

The objectives of the present disclosure are not limited to those mentioned above, and other objectives not mentioned will be clearly understood by those skilled in the art from the following description.

According to an embodiment of the present disclosure, a wafer expander for supporting a dicing tape to which a plurality of dies are attached, and for expanding gaps between the plurality of dies, includes a wafer ring fixing an edge of the dicing tape, an expander ring detachably coupled to the wafer ring, and configured to be ascended or descended, and a base ring supporting a bottom side of the dicing tape, and including a first portion configured to be ascended or descended.

According to an embodiment of the present disclosure, a die supplying module for supplying a plurality of dies for mounting on a substrate in a die bonding equipment, includes a wafer expander for supporting a dicing tape to which a plurality of dies are attached, and for expanding gaps between the plurality of dies, and a die ejector that separates the plurality of dies from the dicing tape. The wafer expander includes a wafer ring fixing an edge of the dicing tape, an expander ring detachably coupled to the wafer ring, and configured to be ascended or descended, and a base ring supporting a bottom side of the dicing tape, and including a first portion configured to be ascended or descended.

According to an embodiment of the present disclosure, A die bonding equipment includes a die supplying module that supplies a plurality of dies to be mounted on a substrate, a die transfer module that receives the plurality of dies from the die supplying module, a die stage that receives the plurality of dies from the die transfer module, the plurality of dies being seated on the die stage, a die bonding module that picks up at least one of the plurality of dies from the die stage and bonds the at least one of the dies to the substrate, and a bonding stage that transfers a bonding-completed substrate to a magazine. The die supplying module includes a wafer expander for supporting a dicing tape to which a plurality of dies are attached, and for expanding gaps between the plurality of dies, and a die ejector that separates the plurality of dies from the dicing tap. The wafer expander includes a wafer ring fixing an edge of the dicing tape, an expander ring detachably coupled to the wafer ring, and configured to be ascended or descended, and a base ring supporting a bottom side of the dicing tape, and including a first portion configured to be ascended or descended.

According to the present disclosure, gaps between the dies can be uniformly expanded by configuring a portion of the base ring that supports the bottom side of the dicing tape to be liftable in the wafer expander.

The effects of the present disclosure are not limited to those mentioned above, and other effects not mentioned will be clearly understood by those skilled in the art from the following description.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Figure 1:
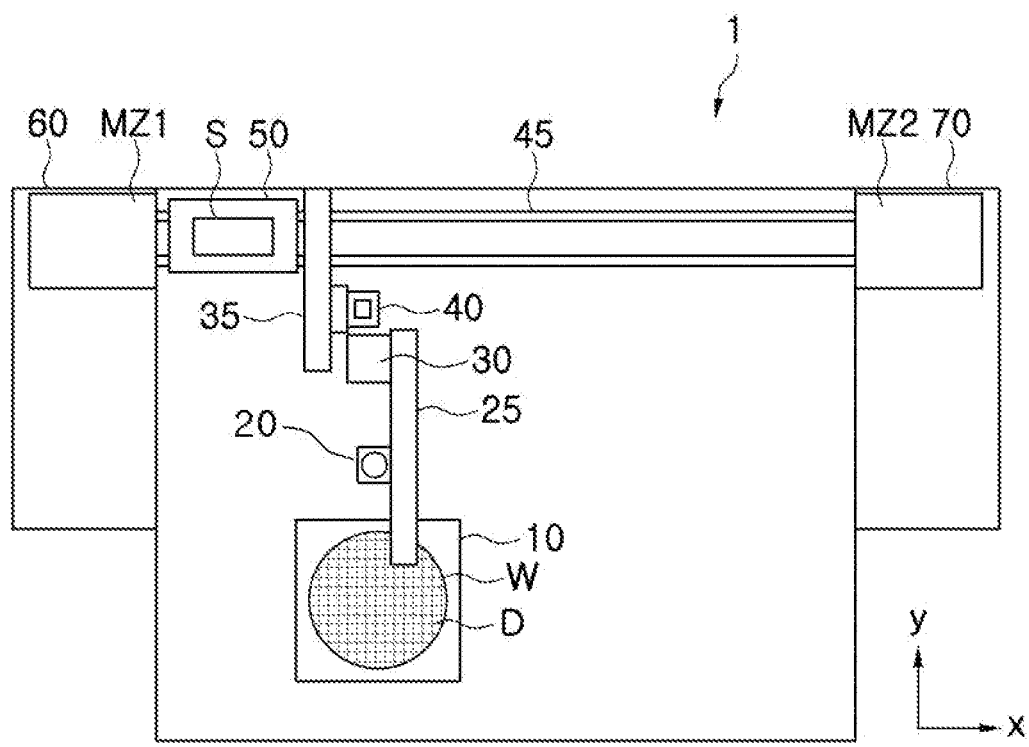
FIG. 1 shows a schematic layout of die bonding equipment to which the present disclosure may be applied.

Hereinafter, with reference to the accompanying drawings, embodiments of the present disclosure will be described in detail so that those of ordinary skill in the art can easily carry out the present disclosure. The present disclosure may be embodied in many different forms and is not limited to the embodiments described herein.

In order to clearly explain the present disclosure, parts irrelevant to the description are omitted, and the same reference numerals are given to the same or similar elements throughout the specification.

In addition, in various embodiments, components having the same configuration will be described only in the representative embodiment using the same reference numerals, and only configurations different from the representative embodiment will be described in other embodiments.

Throughout the specification, when a part is said to be "connected (or coupled)" with another part, this includes not only the case of "directly connected (or coupled)" but also the case of "indirectly connected (or coupled)" with another member therebetween. Also, when a part "includes" a certain component, it means that other components may be further included, rather than excluding other components, unless otherwise stated.

Unless defined otherwise, all terms used herein, including technical or scientific terms, have the same meaning as commonly understood by those of ordinary skill in the art to which the present disclosure pertains. Terms such as those defined in a commonly used dictionary should be interpreted as having a meaning consistent with the meaning in the context of the related art, unless explicitly defined in this application, it should not be construed in an ideal or overly formal sense.

FIG. 1 shows a schematic layout of die bonding equipment 1 to which the present disclosure may be applied. The die bonding equipment 1 is an equipment for performing die bonding process of attaching individualized dies separated from a wafer through dicing process to a substrate (e.g., a printed circuit board (PCB)). A wafer W composed of individualized dies is put into the die bonding equipment 1, and after each die is bonded to the substrate S loaded in the magazine MZ1, the substrate S on which bonding has been completed is loaded in the magazine MZ2.

The die bonding equipment 1 according to the present disclosure includes: a die supplying module 10 that supplies dies D for mounting on a substrate S; a die transfer module 20 that transfers the dies D from the die supplying module 10; a die stage 30 on which the dies D are seated from the die transfer module 20; a die bonding module 40 that picks up the dies D from the die stage 30 and bonds the dies D to the substrate S; and a bonding stage 50 that transfers the substrate S and transfers a bonding-completed substrate S to a magazine MZ2.

Referring to FIG. 1, a wafer W singularized into a plurality of dies D is transferred from a cassette (not shown) to the die supplying module 10, and the individual dies D are separated from the wafer W by the die supplying module 10. The dies D separated from the wafer W are transferred to the die stage 30 by the die transfer module 20. Here, the die transfer module 20 may be moved along the horizontal direction (y direction) by a gantry 25.

Inspection of the die D is performed on the die stage 30 by a vision inspection module (not shown) located on the upper or lower side. After the dies D are picked up from the die stage 30 by the die bonding module 40, the dies D are bonded to the substrate S positioned on the bonding stage 50. Likewise, the die bonding module 40 is installed on the gantry 35 and is configured to be movable along the horizontal direction (y direction). Also, a vision unit (not shown) may be provided on the upper side to determine a precise bonding position.

Meanwhile, the die bonding equipment 1 may include: a magazine loader 60 in which the magazine MZ1 accommodating the substrates S is loaded, and providing the substrates S from the magazine MZ1 to the bonding stage 50; and a magazine unloader 70 that stores and discharges the magazine MZ2 accommodating the bonding-completed substrates S. The substrate S is supplied from the magazine loader 60 to the bonding stage 50, the bonding stage 50 moves in the horizontal direction (x direction) along a guide rail 45, and the dies D are bonded on the substrate S by the die bonding module 40. The substrate S to which all the dies D are bonded is accommodated in the magazine MZ2.

Hereinafter, a detailed configuration of the die supplying module 10 will be described with reference to FIG. 2.

Figure 2:
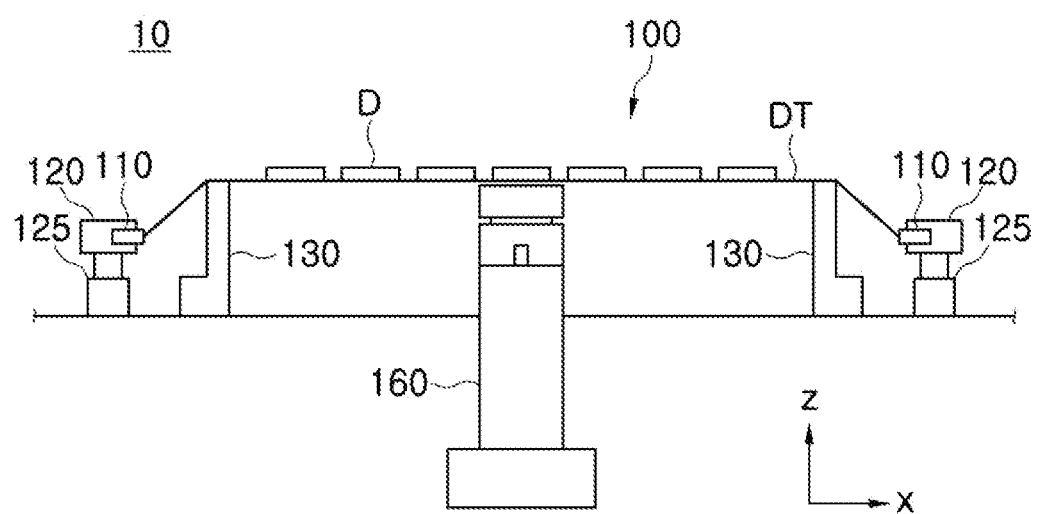
FIG. 2 shows a schematic structure of a die supplying module to which the present disclosure may be applied.

FIG. 2 shows a schematic structure of a die supplying module 10 to which the present disclosure may be applied. The die supplying module 10 separates the dies D from the wafer W singularized into a plurality of dies D, and the separated dies D are picked up by the die transfer module 20. The wafer W is singularized into the plurality of dies D through dicing process, and is supplied to the die supplying module 10 with a dicing tape DT attached thereunder. Although not specifically shown, a die attach film (DAF) is attached to the bottom of the die D, and the die D may be temporarily attached to the dicing tape DT by the die attach film (DAF). Here, the dies D are supplied to the die supplying module 10 while the edge of the dicing tape DT being fixed by a wafer ring 110. The wafer ring 110 is bonded on the edge of the dicing tape DT using adhesive material. Therefore, the wafer ring 110 holds the edge of the dicing tape DT. The die supplying module 10 may separate the dies D from the dicing tape DT so that the die transfer module 20 may pick up the dies.

The die supplying module 10 includes: a wafer expander 100 for supporting the dicing tape DT to which a plurality of dies D are attached, and for expanding gaps between the plurality of dies D; and a die ejector 160 that separates the dies from the dicing tape DT.

As shown in FIG. 2, the wafer expander 100 may include an expander ring 120 detachably coupled to a wafer ring 110 that fixes the edge of the dicing tape DT, and a base ring 130 supporting the bottom side of the dicing tape DT.

The expander ring 120 is coupled to a lifting device 125 at the lower side and may ascend and descend, and when the expander ring 120 descends, the dicing tape DT is stretched together, and the gap between the dies D is widened. When the gap between the dies D is widened, the die D may be separated from the dicing tape DT by the die ejector 160.

Figure 3:
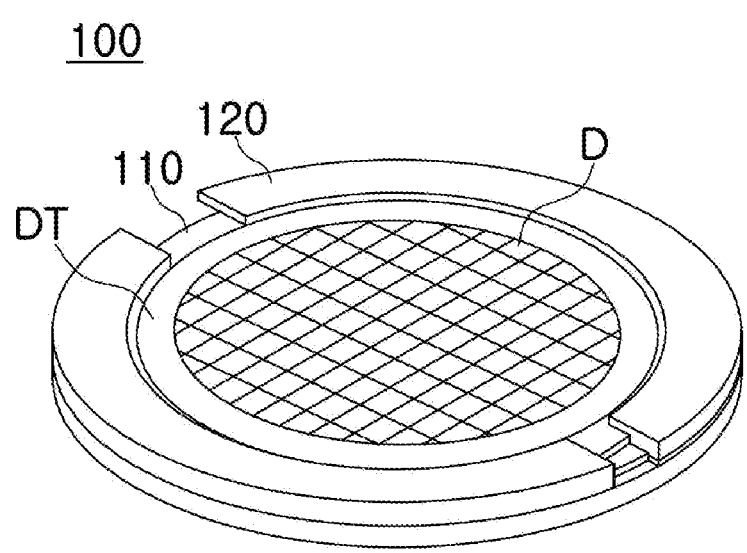
FIG. 3 shows a schematic appearance of a wafer expander for expanding gaps between dies.

FIG. 3 shows a schematic appearance of a wafer expander 100 for expanding gaps between dies D. The expander ring 120 is configured to descend while the wafer ring 110 is fixed, and as the dicing tape DT is stretched by the descent of the expander ring 120 and the wafer ring 110, a gap between the dies D is created.

Figure 4:
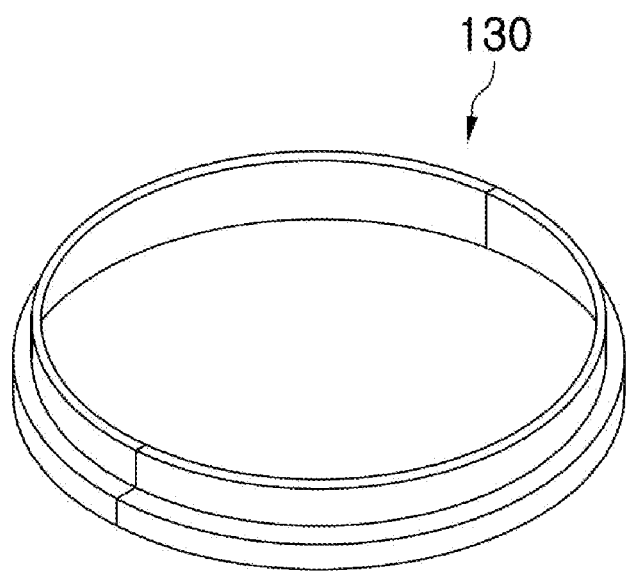
FIG. 4 shows an example of a base ring in a wafer expander.

FIG. 4 shows an example of a base ring 130 in a wafer expander 100.

The base ring 130 is provided in the form of a circular ring as shown in FIG. 4 and serves to support the bottom side of the dicing tape DT. According to the present disclosure, at least a portion of the base ring 130 is configured to be liftable. That is, the whole of the base ring 130 may ascend, and some parts of the base ring 130 may ascend. When the base ring 130 ascends in addition to the descent of the expander ring 120, the dicing tape DT may be further stretched, and the gap between the dies D may be further adjusted by additional stretching of the dicing tape DT.

In particular, the present disclosure provides a method of uniformly adjusting the die D gap in the width direction and the height direction in the dies D having a large aspect ratio.

Figure 5:
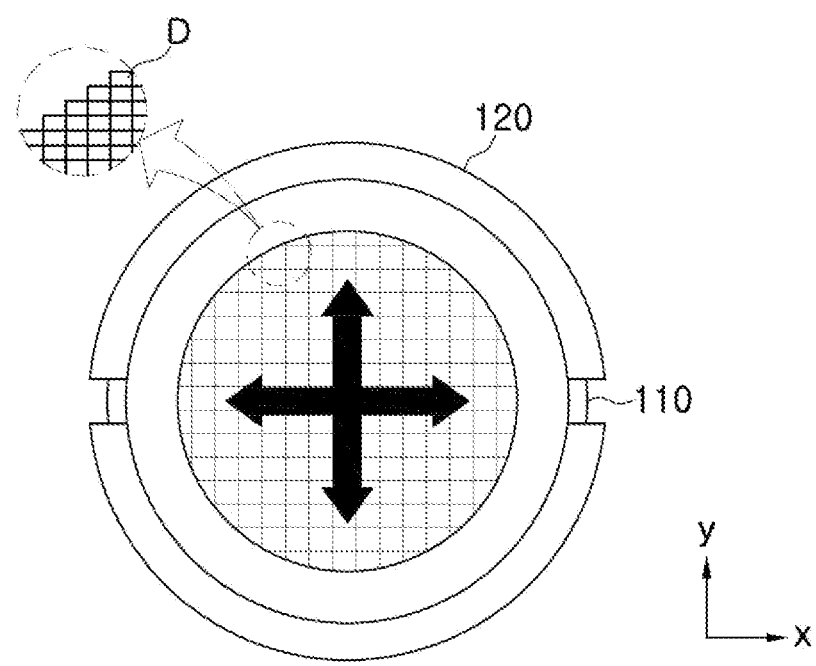
FIG. 5 is a view for explaining a process of expanding gaps for dies having a large aspect ratio.

FIG. 5 is a view for explaining a process of expanding gaps for dies D having a large aspect ratio.

As shown in FIG. 5, in the case of dies D with a large width compared to the height, when the dicing tape DT is stretched equally in the transverse direction (width direction, x direction) and longitudinal direction (height direction, y direction), the die D gaps in the longitudinal direction may be sufficiently widened, but the die D gaps in the transverse direction may be not be widened enough. That is, the gaps between the dies D may become non-uniform. In this case, it is necessary to make the gaps between the dies D uniform through additional expansion in the transverse direction since the dies D may not be picked up properly. Accordingly, an embodiment of the present disclosure provides a method of configuring some sections located in the transverse direction in the base ring 130 to be liftable for additional expansion with respect to the transverse direction.

In other words, the base ring 130 according to the present disclosure is configured so that at least a portion thereof may ascend and descend. In particular, the portion corresponding to the width direction of the dies D may be configured to be liftable.

Figure 6A:
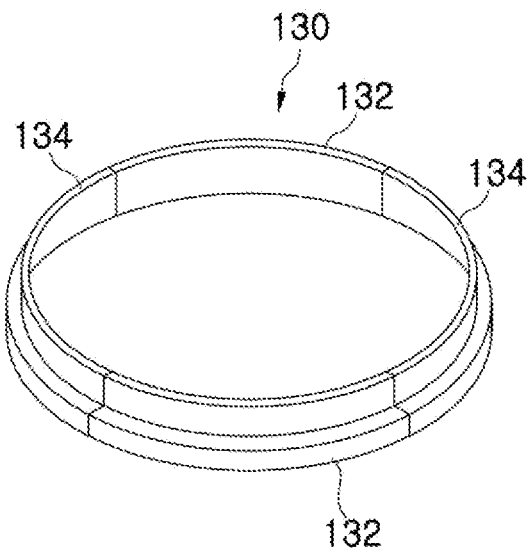
FIGS. 6A and 6B show a base ring configured to be liftable in some sections thereof in an embodiment of the present disclosure.
Figure 6B:
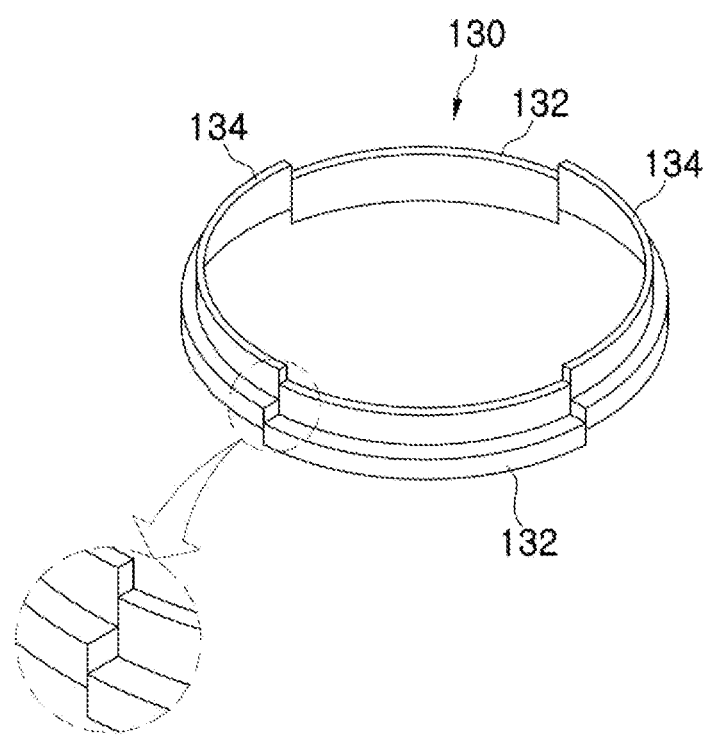

FIGS. 6A and 6B show a base ring 130 configured to be liftable in some sections thereof in an embodiment of the present disclosure. FIG. 6A shows the base ring 130 in a state in which lifting base members 134 descend, and FIG. 6B shows the base ring 130 in a state in which the lifting base members 134 ascend.

According to the embodiment of the present disclosure, the base ring 130 may include: a fixed base member 132 fixed at a bottom surface to form a fixed section; and the lifting base member 134 configured to be liftable with respect to the bottom surface to form a variable height section.

Referring to FIGS. 6A and 6B, the lifting base member 134 is configured to be liftable while the fixed base member 132 is fixed at the bottom surface. As the lifting base member 134 ascends, the dicing tape DT is additionally stretched in the variable height section in which the lifting base member 134 is positioned, so that the gaps between the dies D may be further expanded.

Figure 7A:
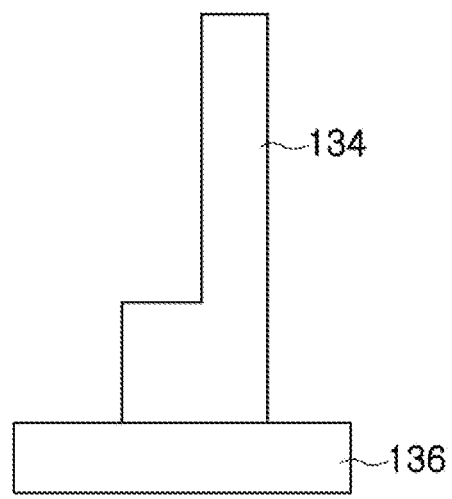
FIGS. 7A and 7B are cross-sectional views of the base ring configured to be liftable in some sections thereof in the embodiment of the present disclosure.
Figure 7B:
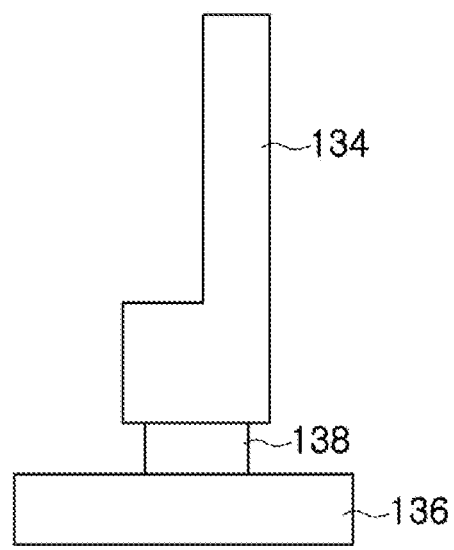

FIGS. 7A and 7B are cross-sectional views of the base ring 130 configured to be liftable in some sections thereof in the embodiment of the present disclosure. FIG. 7A shows the base ring 130 in a state in which the lifting base member 134 descends, and FIG. 7B shows the base ring 130 in a state in which the lifting base member 134 ascends.

According to the embodiment of the present disclosure, the lifting base member 134 may be configured to be liftable by a lifting device located at the lower side.

Referring to FIGS. 7A and 7B, the lifting base member 134 may be lifted by the lifting device 136 located at the lower side. The lifting device 136 may lift up the lifting base member 134 via a lifting shaft 138 coupled to the lifting base member 134.

Figure 8A:
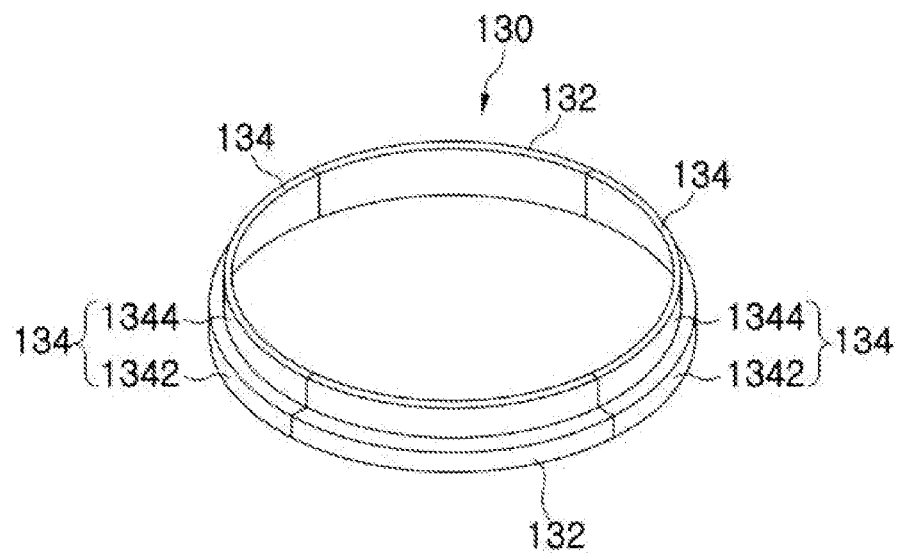
FIGS. 8A and 8B show a base ring configured to be liftable in some sections thereof in an embodiment of the present disclosure.
Figure 8B:
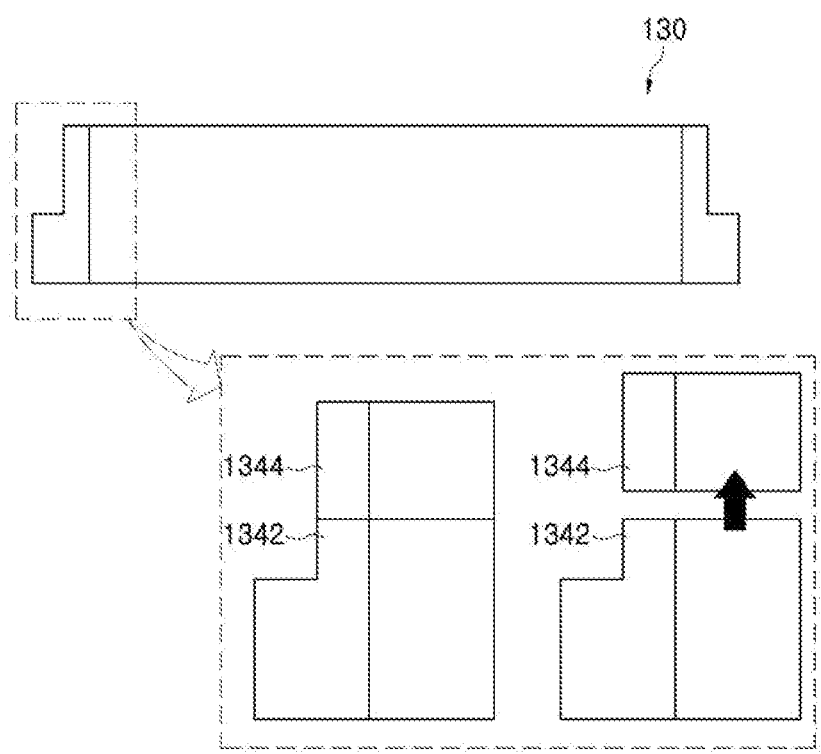

FIGS. 8A and 8B show a base ring configured to be liftable in some sections thereof in an embodiment of the present disclosure. According to an embodiment of the present disclosure, the lifting base member 134 includes a lower lifting base member 1342 configured to be fixed, and an upper lifting base member 1344 configured to be liftable. FIG. 8A shows the base ring 130 in a state in which the upper lifting base members 1344 descend, and FIG. 8B shows the base ring 130 in a state in which the upper lifting base members 1344 ascend.

According to the embodiment of the present disclosure, the base ring 130 includes: the lower lifting base member 1342 fixed at the bottom surface; and the upper lifting base member 1344 configured to be liftable with respect to the lower lifting base member 1342 by a lifting device 136.

Referring to FIGS. 8A and 8B, the upper lifting base member 1344 of the lifting base member 134 is configured to be liftable while the fixed base member 132 is fixed at the bottom surface. As the upper lifting base member 1344 supporting the bottom side of the dicing tape DT ascends, the dicing tape DT is additionally stretched in the variable height section in which the lifting base member 134 is positioned, so that the gaps between the dies D may be further expanded.

Figure 9A:
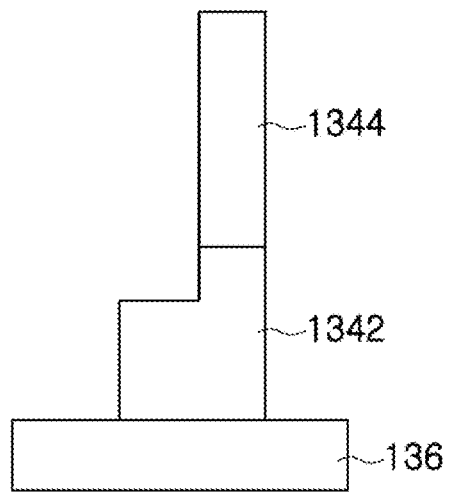
FIGS. 9A and 9B are cross-sectional views of the base ring configured to be liftable in some sections thereof in an embodiment of the present disclosure.
Figure 9B:
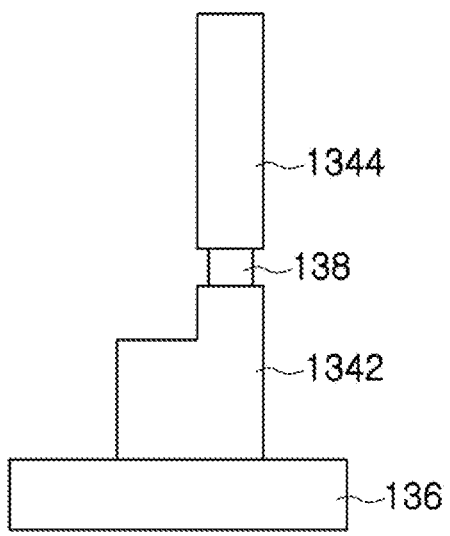

FIGS. 9A and 9B are cross-sectional views of the base ring 130 configured to be liftable in some sections thereof in an embodiment of the present disclosure. FIG. 9A shows the base ring 130 in a state in which the upper lifting base member 134 descends, and FIG. 9B shows the base ring 130 in a state in which the upper lifting base member 134 ascends.

Referring to FIGS. 9A and 9B, the lifting device 136 is provided at the lower side of the lower lifting base member 1342, and the lifting shaft 138 is coupled to the upper lifting base member 1344 through the lower lifting base member 1342. The upper lifting base member 1344 may ascend by the ascent of the lifting shaft 138 while the lower lifting base member 1342 is fixed at the bottom surface.

Figure 10:
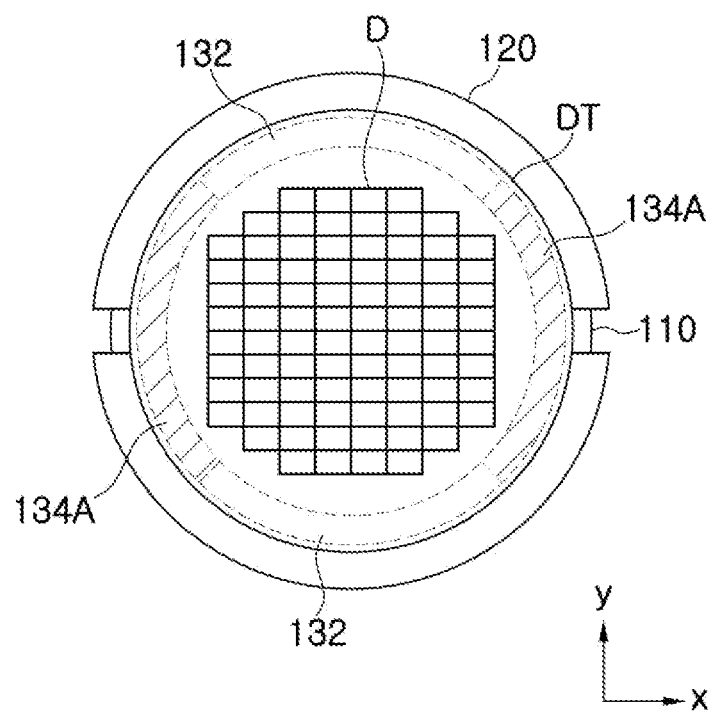
FIGS. 10 and 11 show a fixed height section and a variable height section of the base ring in the wafer expander according to the embodiment of the present disclosure.
Figure 11:
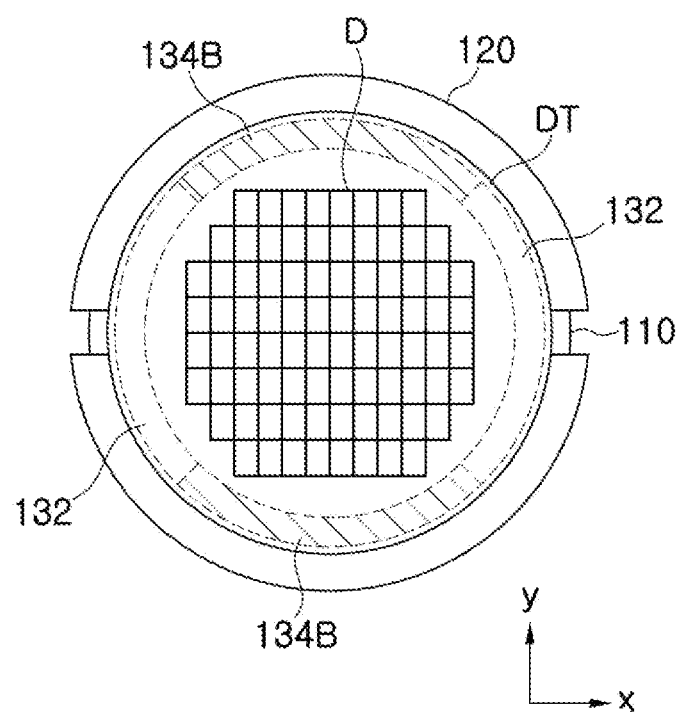

FIGS. 10 and 11 show a fixed height section and a variable height section of the base ring 130 in the wafer expander 100 according to the embodiment of the present disclosure. FIG. 10 shows a case in which the variable height section is formed with respect to the width direction of the dies D, and FIG. 11 shows a case in which the variable height section is formed with respect to the height direction of the dies D.

According to the embodiment of the present disclosure, the lifting base member 134 may include a pair of transverse lifting base members 134A disposed at positions symmetrical to each other along the width direction of the dies D from the center point of the base ring 130. As shown in FIG. 10, the pair of transverse lifting base members 134A may be configured at positions symmetrical to each other in the width direction (x direction) of the dies D having a relatively wide width. As the transverse lifting base members 134A ascend, the dicing tape DT is additionally stretched along the width direction of the dies D, so that the gaps between the dies D may be further expanded.

According to an embodiment of the present disclosure, the lifting base member 134 may include a pair of longitudinal lifting base members 134B disposed at positions symmetrical to each other along a height direction (y direction) of the dies D from the center point of the base ring. As shown in FIG. 11, the pair of longitudinal lifting base members 134B may be configured at positions symmetrical to each other in the height direction (y direction) of the dies D having a relatively wide width. As the longitudinal lifting base members 134B ascend, the dicing tape DT is additionally stretched along the height direction of the dies D, so that the gaps between the dies D may be further expanded.

Figure 12A:
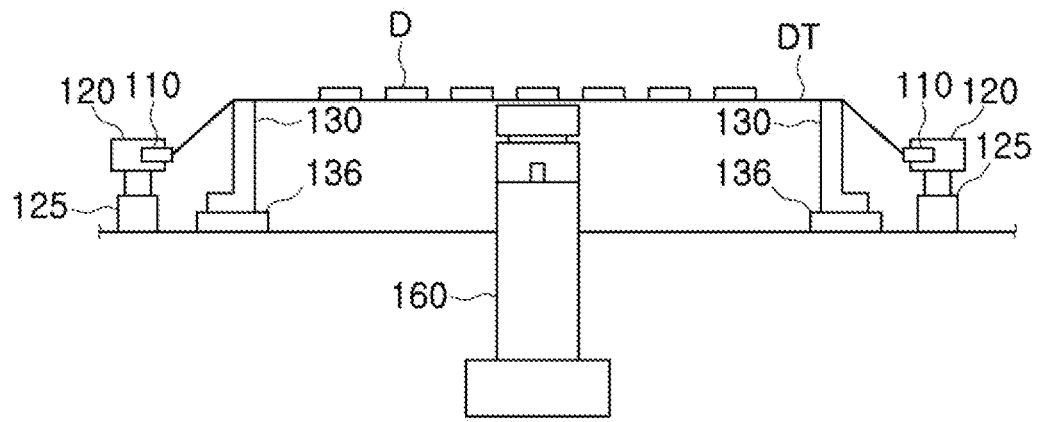
FIGS. 12A, 12B, and 12C show a process of expanding gaps between dies in the wafer expander according to the embodiment of the present disclosure.
Figure 12B:
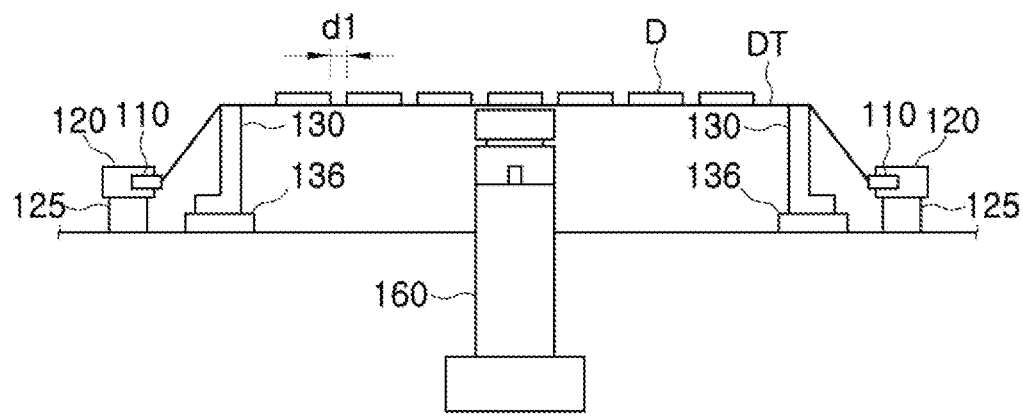
Figure 12C:
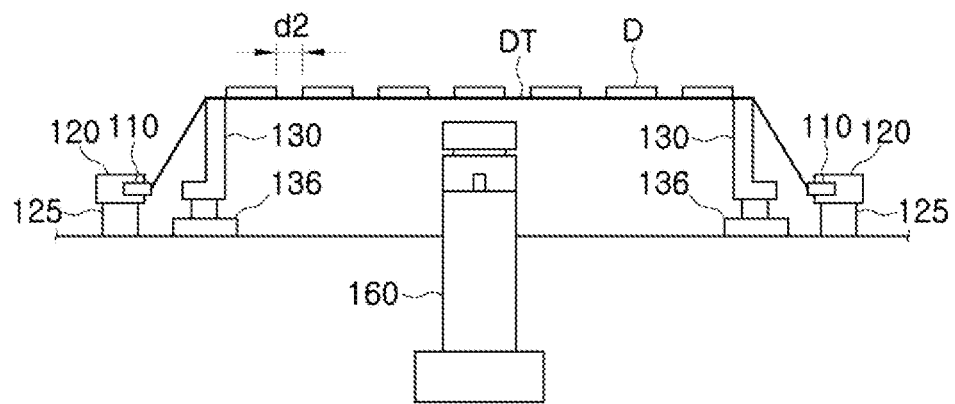

FIGS. 12A, 12B, and 12C show a process of expanding gaps between dies D in the wafer expander 100 according to the embodiment of the present disclosure. FIG. 12A shows an initial state in which the wafer ring 110 is detachably coupled to the expander ring 120, FIG. 12B shows a state in which the expander ring 120 descends and the gaps between the dies D are primarily expanded, and FIG. 12C shows a state in which the base ring 130 ascends and the gaps between the dies D are secondarily or further expanded.

According to the embodiment of the present disclosure, the gaps between the dies D are primarily expanded by the descent of the expander ring 120, and the gaps between the dies D are secondarily expanded by the ascent of the base ring 130.

First, when the wafer W is initially provided to the die supplying module 10, the wafer ring 110 is detachably coupled to the expander ring 120 as shown in FIG. 12A. Then, as shown in FIG. 12B, the dicing tape DT is expanded in all directions by the descent of the expander ring 120 so that the gap between the dies D expands like a first gap d1. Next, as shown in FIG. 12C, all or a portion of the base ring 130 ascends so that the gap between the dies D expands like a second gap d2 larger than the first gap d1. As shown in FIGS. 10 and 11, a relative expansion direction may be determined according to the position of the lifting base member 134 in the base ring 130.

Figure 13:
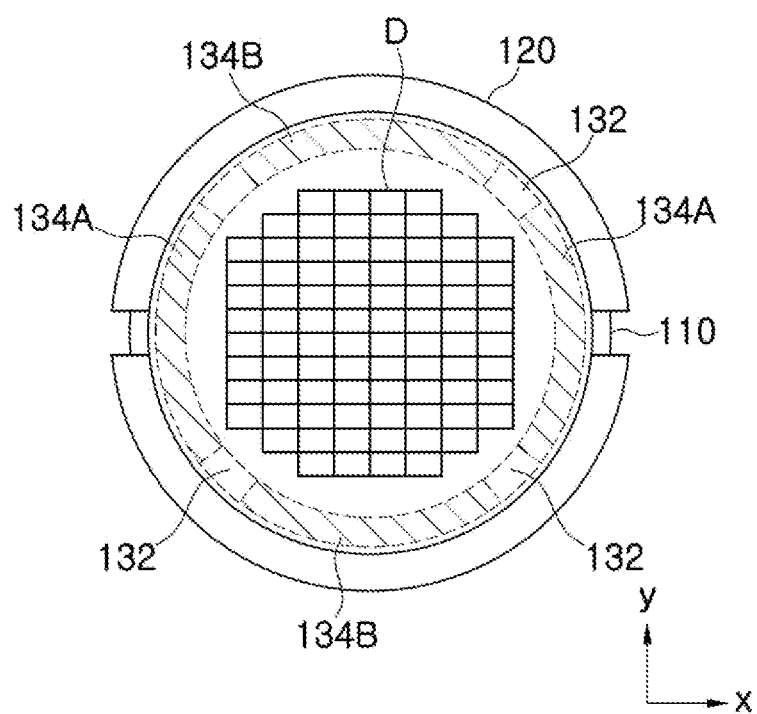
FIG. 13 shows an example of the fixed height section and the variable height section of the base ring in the wafer expander according to the embodiment of the present disclosure.

FIG. 13 shows an example of the fixed height section and the variable height section of the base ring in the wafer expander 100 according to the embodiment of the present disclosure.

According to the embodiment of the present disclosure, the lifting base member 134 includes: a pair of transverse lifting base members 134A disposed at positions symmetrical to each other along the width direction (x direction) of the dies D; and a pair of longitudinal lifting base members 134B disposed at positions symmetrical to each other along the height direction (y direction) of the dies D. The pair of transverse lifting base members 134A and the pair of longitudinal lifting base members 134B may be configured to ascend and descend by separate lifting devices, respectively.

As the pair of transverse lifting base members 134A and the pair of longitudinal lifting base members 134B variably ascend and descend by separate lifting devices, the stretching direction and the extent of stretching of the dicing tape DT may be adjusted depending on the shape of the die D.

Figure 14:
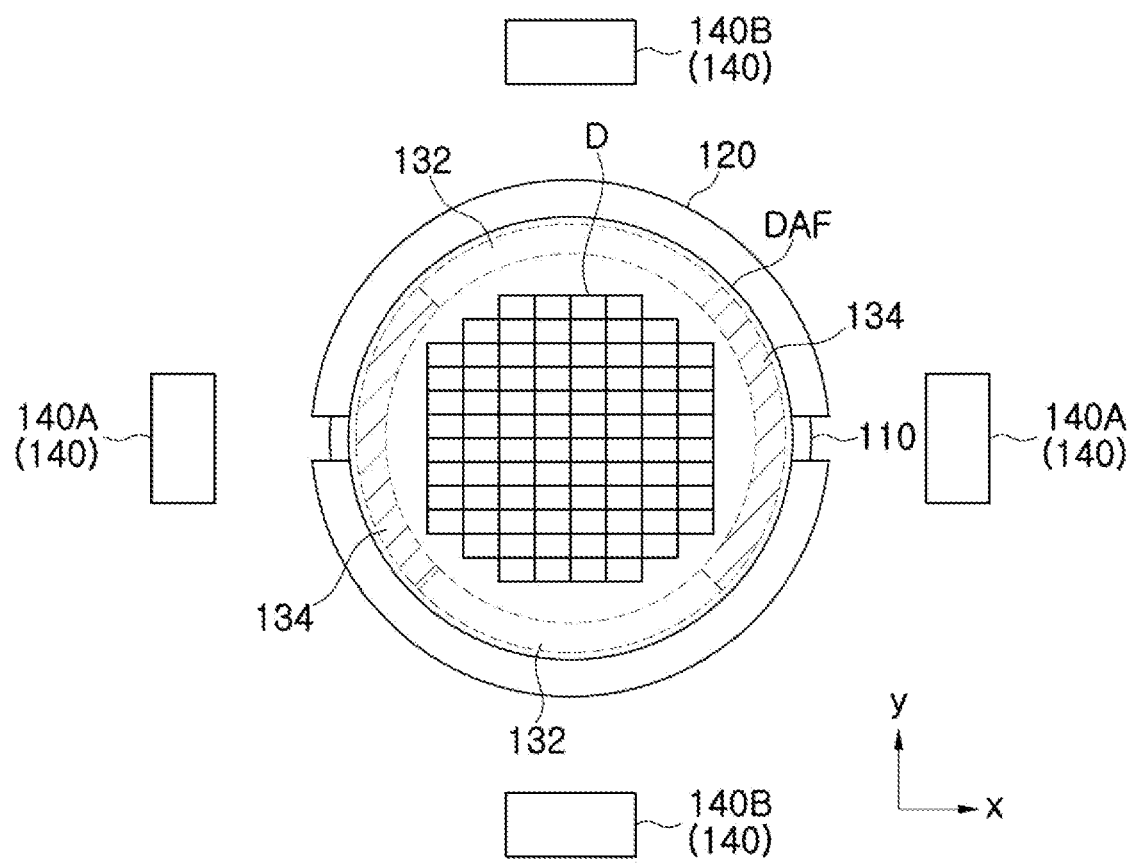
FIGS. 14 and 15 are views for explaining the wafer expander to which a heating member is applied.
Figure 15:
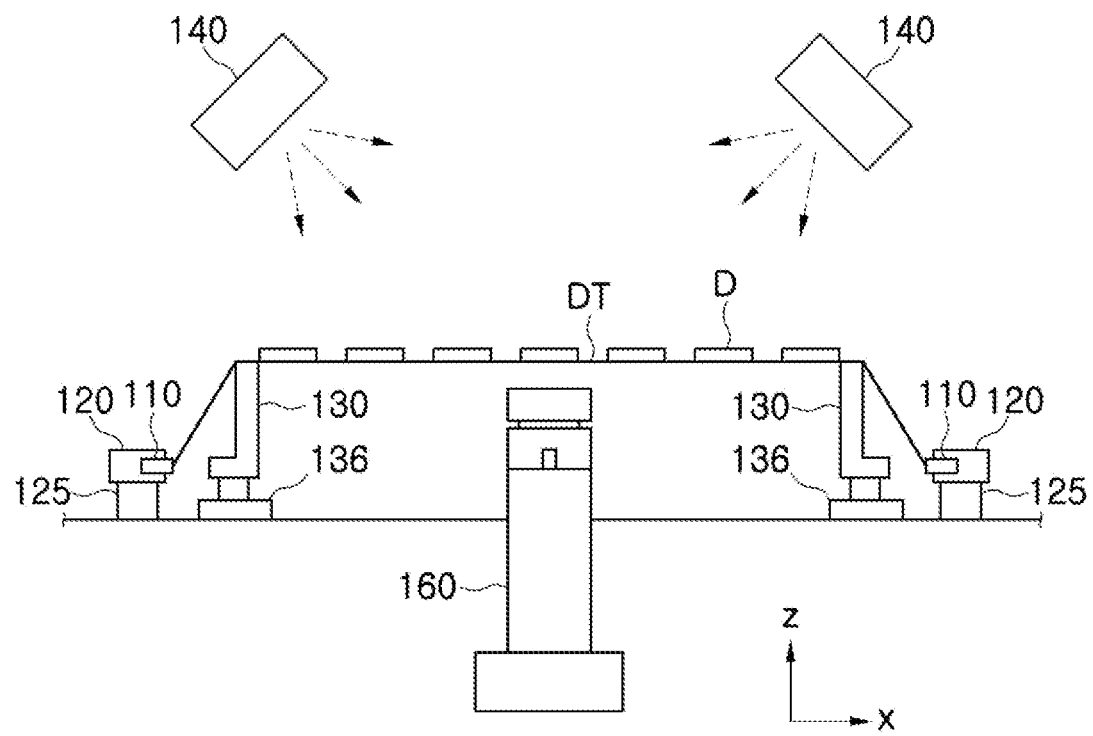

FIGS. 14 and 15 are views for explaining the wafer expander 100 to which a heating member 140 is applied.

According to the embodiment of the present disclosure, the wafer expander 100 further includes a plurality of heating members 140 that apply thermal energy toward the dicing tape DT. The heating member 140 includes: a pair of transverse heating members 140A disposed at positions symmetrical to each other along the width direction (X direction) of the dies D; and a pair of longitudinal heating members 140B disposed at positions symmetrical to each other along the height direction (y direction) of the dies D.

The heating member 140 may be configured as a lamp or a light emitting diode (LED) for emitting light to apply thermal energy to a specific region of the dicing tape DT. Since the dicing tape DT has a property of being contracted when thermal energy is applied, a region of the dicing tape DT to which thermal energy is applied by the heating member 140 is relatively contracted compared to other regions. Therefore, as in FIGS. 14 and 15, the degree of expansion of the dicing tape DT in the width direction (x direction) and height direction (y direction) of the dies D along with partial ascent and descent of the base ring 130 may be controlled by regulating the thermal energy applied by the disposed heating member 140.

Meanwhile, the above-described wafer expander 100 may be applied to the die supplying module 10 and the die bonding equipment 1 described with reference to FIGS. 1 and 2.

In the die bonding equipment 1 according to the embodiment of the present disclosure, the die supplying module 10 that supplies dies D for mounting on a substrate S includes: a wafer expander 100 for supporting a dicing tape DT to which a plurality of dies D are attached, and for expanding a gap between the plurality of dies; and a die ejector 160 that separates the die D from the dicing tape DT. The wafer expander 100 includes: an expander ring 120 detachably coupled to a wafer ring 110 that fixes the edge of the dicing tape DT, and configured to ascend and descend; and a base ring 130 supporting a bottom side of the dicing tape DT, and at least a portion thereof is configured to ascend and descend.

According to the embodiment of the present disclosure, the gaps between the dies D may be primarily expanded by the descent of the expander ring 120, and the gaps between the dies D may be secondarily expanded by the ascent of the base ring 130.

According to the embodiment of the present disclosure, the base ring 130 may include: a fixed base member 132 fixed at the bottom surface to form a fixed section; and the lifting base member 134 configured to be liftable with respect to the bottom surface to form a variable height section.

According to the embodiment of the present disclosure, the lifting base member 134 may be configured to be liftable by a lifting device 136 located at a lower side.

According to the embodiment of the present disclosure, the lifting base member 134 may include: the lower lifting base member 1342 fixed at the bottom surface; and the upper lifting base member 1344 configured to be liftable with respect to the lower lifting base member 1342 by the lifting device 136.

According to the embodiment of the present disclosure, the lifting base member 134 may include a pair of lifting base members disposed at positions symmetrical to each other from the center point of the base ring 130.

According to the embodiment of the present disclosure, the lifting base member 134 may include a pair of transverse lifting base members 134A disposed at positions symmetrical to each other along the width direction (x direction) of the dies D from the center point of the base ring 130.

According to the embodiment of the present disclosure, the lifting base member 134 may include a pair of longitudinal lifting base members 134B disposed at positions symmetrical to each other along the height direction (y direction) of the dies D from the center point of the base ring 130.

According to the embodiment of the present disclosure, the lifting base member 134 may be configured to include: the pair of transverse lifting base members 134A disposed at positions symmetrical to each other along the width direction of the dies D; and a pair of longitudinal lifting base members 134B disposed at positions symmetrical to each other along the height direction of the dies D, and the pair of transverse lifting base members 134A and the pair of longitudinal lifting base members 134B may be configured to ascend and descend by separate lifting devices 136, respectively.

According to the embodiment of the present disclosure, the wafer expander 100 may further include a plurality of heating members 140 that apply thermal energy toward the dicing tape DT. The heating member 140 may include: a pair of transverse heating members 140A disposed at positions symmetrical to each other along the width direction (x direction) of the dies D; and a pair of longitudinal heating members 140B disposed at positions symmetrical to each other along the height direction (y direction) of the dies D.

The embodiments and the accompanying drawings in this specification only clearly show a part of the technical idea included in the present disclosure, and thus it will be apparent that all modifications and specific embodiments that can be easily inferred by those skilled in the art within the scope of the technical idea included in the specification and drawings of the present disclosure are included in the scope of the present disclosure.

Therefore, the spirit of the present disclosure should not be limited to the described embodiments, and not only the claims to be described later, but also all equivalents or equivalent modifications to the claims should be construed as being included in the scope of the spirit of the present disclosure.

What is claimed is:

1. A wafer expander for supporting a dicing tape to which a plurality of dies are attached, and for expanding gaps between the plurality of dies, the wafer expander comprising:
a wafer ring fixing an edge of the dicing tape;
an expander ring detachably coupled to the wafer ring, and configured to be ascended or descended; and
a base ring supporting a bottom side of the dicing tape, and including a first portion configured to be ascended or descended,
wherein the base ring comprises:
a fixed base member configured to provide a fixed section for the wafer expander; and
a lifting base member, as the first portion, configured to be ascended with respect to the fixed base member to a variable height relative to a bottom surface of the fixed base member.

2. The wafer expander of claim 1,
wherein at a first position of the expander ring and a first position of the first portion of the base ring, the plurality of dies are attached on the dicing tape at a first spacing,
wherein at a second position of the expander ring and at the first position of the first portion of the base ring, the plurality of dies are attached on the dicing tape at a second spacing greater than the first spacing,
wherein at the second position of the expander ring and a second position of the first portion of the base ring, the plurality of dies are attached on the dice-dicing tape at a third spacing greater than the second spacing,
wherein the first position of the expander ring is a position where the wafer expander is ascended,
wherein the second position of the expander ring is a position where the wafer expander is descended from the first position of the expander ring,
wherein the first position of the first portion of the base ring is a position where the first portion is descended, and
wherein the second position of the first portion of the base ring is a position where the first portion is ascended from the first position of the first portion of the base ring.

3. The wafer expander of claim 1, further comprising:
a lifting device located at a lower side of the base ring,
wherein the lifting device is configured to lift the lifting base member so that the lifting base member is ascended.

4. The wafer expander of claim 1, further comprising:
a lifting device located at a lower side of the base ring,
wherein the lifting base member includes:
a lower lifting base member provided as the fixed section for the wafer expander; and
an upper lifting base member configured to be ascended with respect to the lower lifting base member, and
wherein the lifting device is configured to lift the upper lifting base member to the variable height.

5. The wafer expander of claim 1,
wherein the lifting base member includes a pair of lifting base members disposed at positions symmetrical to each other from a center point of the base ring.

6. The wafer expander of claim 5,
wherein the lifting base member includes a pair of transverse lifting base members disposed at positions symmetrical to each other along a width direction of the plurality of dies from the center point of the base ring.

7. The wafer expander of claim 5,
wherein the lifting base member includes a pair of longitudinal lifting base members disposed at positions symmetrical to each other along a height direction of the plurality of dies from the center point of the base ring.

8. The wafer expander of claim 1,
wherein the lifting base member includes:
a pair of transverse lifting base members disposed at positions symmetrical to each other along a width direction of the plurality of dies; and
a pair of longitudinal lifting base members disposed at positions symmetrical to each other along a height direction of the plurality of dies, and
wherein the pair of transverse lifting base members and the pair of longitudinal lifting base members are configured to ascend and descend by separate lifting devices, respectively.

9. The wafer expander of claim 1, further comprising:
a plurality of heating members for applying thermal energy toward the dicing tape,
wherein the plurality of heating members include:

a pair of longitudinal heating members disposed at positions symmetrical to each other along a height direction of the plurality of dies, and a pair of transverse heating members disposed at positions symmetrical to each other along a width direction of the plurality of dies.

* * * * *